United States Patent [19]
Hatai et al.

[11] Patent Number: 6,103,428
[45] Date of Patent: Aug. 15, 2000

[54] PHOTOMASK UTILIZING AUXILIARY PATTERN THAT IS NOT TRANSFERRED WITH THE RESIST PATTERN

[75] Inventors: Tetsuya Hatai, Tenri; Hiroki Tabuchi, Nara; Masashi Inoue, Sakai, all of Japan

[73] Assignee: Sharp Kabushiki Kaisha, Osaka, Japan

[21] Appl. No.: 09/042,711

[22] Filed: Mar. 17, 1998

[30] Foreign Application Priority Data

Mar. 21, 1997 [JP] Japan ................................. 9-068615

[51] Int. Cl.$^7$ ................................................ G03F 9/00
[52] U.S. Cl. ............................................................ 430/5
[58] Field of Search ....................................... 430/5

[56] References Cited

U.S. PATENT DOCUMENTS 5,786,113  7/1998  Hashimoto et al. .................. 430/5
5,840,447  11/1998  Peng ...................................... 430/5

FOREIGN PATENT DOCUMENTS 5-323569  12/1993  Japan .
6-118617  4/1994  Japan .

Primary Examiner—Christopher G. Young
Attorney, Agent, or Firm—Nixon & Vanderhye P.C.

[57] ABSTRACT

A photomask for use in manufacturing a semiconductor includes a chrome pattern serving as a mask pattern. The chrome pattern is formed so as to have a size substantially equivalent to a wavelength of an exposure light at an interval substantially equivalent to the wavelength. The chrome pattern includes a band-shaped first chrome pattern and a second chrome pattern having a side in the widthwise direction substantially orthogonal to the side in the lengthwise direction of the first chrome pattern. Then, auxiliary patterns of a size of not more than the wavelength of the exposure light, which have a function of reducing the exposure light or shifting the phase of the exposure light, are formed at both corners of the side of the second chrome pattern so as to partially overlap the second chrome pattern. When forming a resist pattern of a size substantially equivalent to the wavelength of the exposure light or a resist pattern at an interval substantially equivalent to the wavelength of the exposure light, the described photomask suppresses the backward shift of the corner of the first resist pattern corresponding to the auxiliary patterns as well as the deformation of the second resist pattern positioned apart from the corner by a distance substantially equivalent to the wavelength of the exposure light.

26 Claims, 6 Drawing Sheets

PHOTOMASK UTILIZING AUXILIARY PATTERN THAT IS NOT TRANSFERRED WITH THE RESIST PATTERN

FIELD OF THE INVENTION

The present invention relates to a photomask for use in manufacturing a semiconductor device and a method of forming a resist pattern which realizes a fine patterning with high precision.

BACKGROUND OF THE INVENTION

Recently, a technique which realizes a still finer patterning process is more strongly desired for a manufacturing process of a semiconductor integrated circuit to meet a demand for an improvement in precision and a reduction in size. For methods of forming such fine patten, various photo-lithography techniques have been used for practical applications.

For forming a pattern such as wiring, etc., on a semiconductor substrate, the following method is generally adopted. That is, a wiring, etc., is formed by first forming an anti-etching-use mask pattern on a film such as polysilicon film, a metal film, etc., and then carrying out an etching. Here, the photo-lithography process suggests a process of forming a pattern which serves as a mask for etching. For the anti-etching-use mask pattern, a resist (photoconductive resin film) is typically used.

Next, a brief explanation on the method of forming the resist pattern on the semiconductor substrate will be given.

Firstly, while rotating the semiconductor substrate having a wiring-use film, a resist solution is applied onto the semiconductor substrate. Here, as the semiconductor substrate is being rotated, the resist solution can be spread on the entire surface of the semiconductor substrate. As a result, a resist is formed on the semiconductor substrate, thereby forming thereon a resist film.

Secondly, the semiconductor substrate having the resist film is subjected to the exposure process. Here, in an aligner (stepper), a photomask having a predetermined mask pattern (hereinafter referred to as a chrome pattern) consisting of a shielding material such as Cr, etc., is set. In this process of exposure, for the exposure light, it is desirable to use light of a uniform phase having a wavelength of not more than that of the ultraviolet ray. Examples of such desirable light include: i ray (365 nm), KrF eximer laser (248 nm), ArF eximer laser (193 nm), etc.

Lastly, after exposing the semiconductor substrate having formed thereon the resist film, a pre-baking process and a developing process are performed, thereby removing only the area as exposed of the resist film from the semiconductor substrate. As a result, a resist pattern which has the same shape as the mask pattern of the photomask and which is reduced with a predetermined ratio by the reducing projection lens can be formed on the semiconductor substrate.

In the following, explanations on a relationship between (a) the mask pattern of the photomask and (b) the resulting resist pattern to which the mask pattern is transferred will be given in the case of the conventional photo-lithography process of forming a resist pattern having a width substantially equivalent to the wavelength of the exposure light using a positive photoresist in reference to FIG. 5(a) through FIG. 8(b).

Conventional Example 1

Figure 5A:
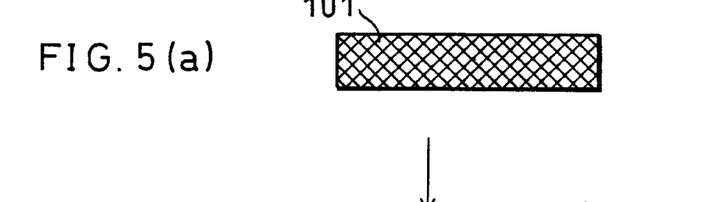
FIG. 5(a) is a plan view schematically showing essential portions of a mask pattern of a conventional example.

As shown in FIG. 5(a), for the mask pattern of the photomask for use in the projection with a reduction of ⅕, a chrome pattern 101 having a width of 1.25 µm is formed on a transparent substrate.

The chrome pattern 101 is transferred to a positive photoresist film on the semiconductor substrate using a KrF eximer laser having a wavelength of 248 nm. As a result, as shown in FIG. 5(b), the chrome pattern 101 is applied onto the resist film with a reduction of ⅕, thereby forming a resist pattern 102 having a width of 0.25 µm.

The chrome pattern 101 is made of Cr. Therefore, the leading end portion of the resist pattern 102 is regulated by the chrome pattern 101 made of Cr.

Figure 5B:
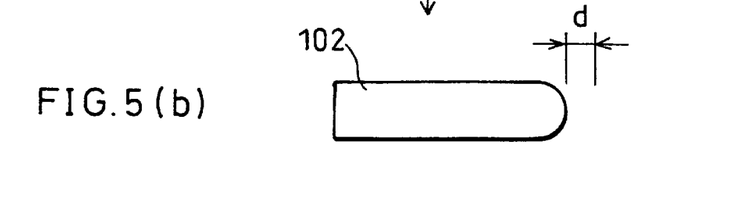
FIG. 5(b) is a plan view schematically showing essential portions of a resist pattern corresponding to the mask pattern of FIG. 5(a)

In the case where the width of the resist pattern 102 is substantially equivalent to the wavelength of the exposure light, as shown in FIG. 5(b), the leading end portion of the resist pattern 102 is shifted backward by an amount "d" (0.13 µ) from the position corresponding to the leading end portion in FIG. 5(a) which shows the reduction-projection of the chrome pattern 101. This backward shift occurs because, as the width of the resist pattern 102 is narrow, the exposure light is wound from three directions at the leading end portion of the chrome pattern 101.

For the method of suppressing the described backward shift of the resist pattern, the following two methods have been proposed.

As shown in FIG. 6(a) through FIG. 7(b), in the first method, an auxiliary chrome pattern made of a shielding material is formed so as to be not more than the wavelength of the exposure light on the chrome pattern serving as the mask pattern. Here, a resolution of the auxiliary chrome pattern cannot be achieved as size of the auxiliary chrome pattern is not more than the wavelength of the exposure light.

Figures 8A, 8B:
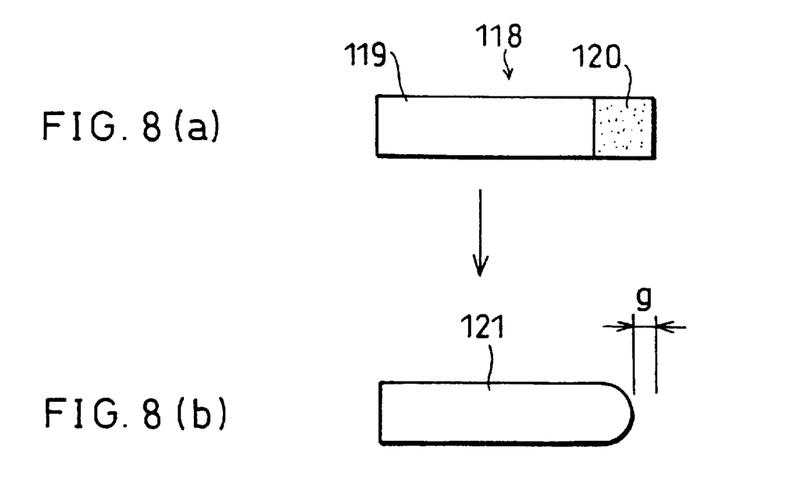
FIG. 8(a) is a plan view schematically showing essential portions of a mask pattern of yet still another conventional example.
FIG. 8(b) is a plan view schematically showing essential portions of a resist pattern corresponding to the mask pattern of FIG. 8(a).

On the other hand, the second method is to adjust the size and the shape of the resist pattern using the phase shifting mask as shown in FIG. 8(a) and FIG. 8(b).

In the below-presented second and third conventional examples, the method of forming the resist pattern by the first method will be explained in reference to FIG. 6(a) through FIG. 7(b).

Second Conventional Example

Figure 6A:
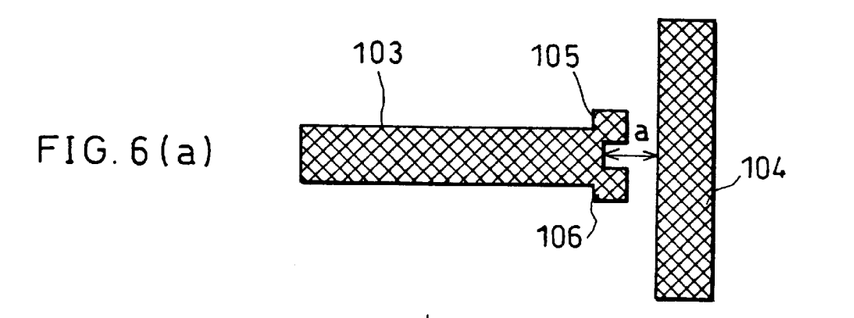
FIG. 6(a) is a plan view schematically showing essential portions of a mask pattern of another conventional example.

As shown in FIG. 6(a), for the mask pattern of the photomask for use in the projection with a reduction of ⅕, chrome patterns 103 and 104 having a width of 1.25 µm are formed on a transparent substrate in directions orthogonal to each other. The chrome patterns 103 and 104 are placed at an interval "a" of 1.25 µm. Then, 0.20 µm square auxiliary chrome patterns 105 and 106 are formed at the leading end portion so as to partially overlap the chrome pattern 103 by a 0.05 µm square.

This mask pattern is transferred to the positive photoresist film on the semiconductor substrate using the KrF eximer laser having a wavelength of 248 nm. As a result, as shown in FIG. 6(b), the mask pattern is applied onto the resist film with a reduction of ⅕, thereby forming the resist patterns 107 and 108 having a width of 0.25 µm.

The chrome patterns 103 and 104 serving as the mask pattern and the auxiliary chrome patterns 105 and 106 are all made of Cr. Therefore, the leading end portion of the resist pattern 106 is regulated by the mask pattern made of Cr. However, as the auxiliary chrome patterns 105 and 106 have a size of not more than a wavelength of the exposure light, the pattern in the shape of the auxiliary chrome patterns 105 and 106 is not formed at the corners 109 of the resist pattern 107.

Figure 6B:
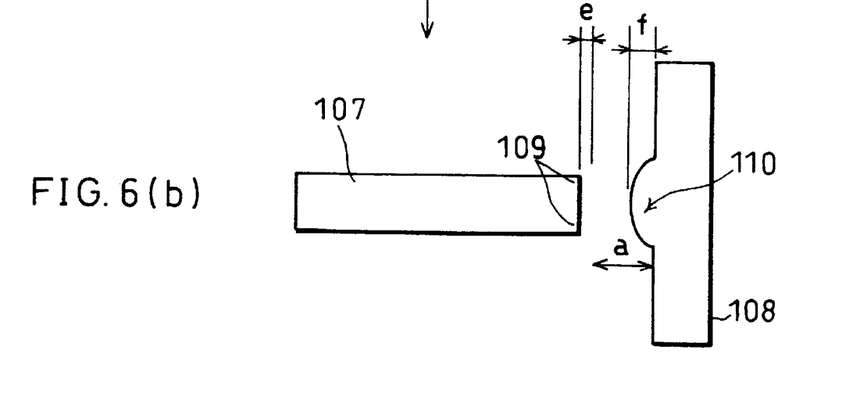
FIG. 6(b) is a plan view schematically showing essential portions of a resist pattern corresponding to the mask pattern of FIG. 6(a)

As shown in FIG. 6(b), by the effects of the auxiliary chrome patterns 105 and 106, the amount "e" of the backward shift of the leading end portion is regulated to be around 0.05 μm.

However, an additional problem arises in that an area 110 of the resist pattern 108, placed in a vicinity of the leading end portion of the resist pattern 107 is deformed by expansion by an amount "f" of around 0.05 μm.

Such deformation by expansion of the area 110 of the resist pattern 108 occurs as the interval between i) the auxiliary chrome patterns 105 and 106 and ii) the chrome pattern 104 is not more than the wavelength of the exposure light, the resolution of the area between i) and ii) is difficult to be achieved. In the worst case, the resist patterns 107 and 108 may be connected by the described deformation by expansion.

Third Conventional Example

Figures 7A, 7B:
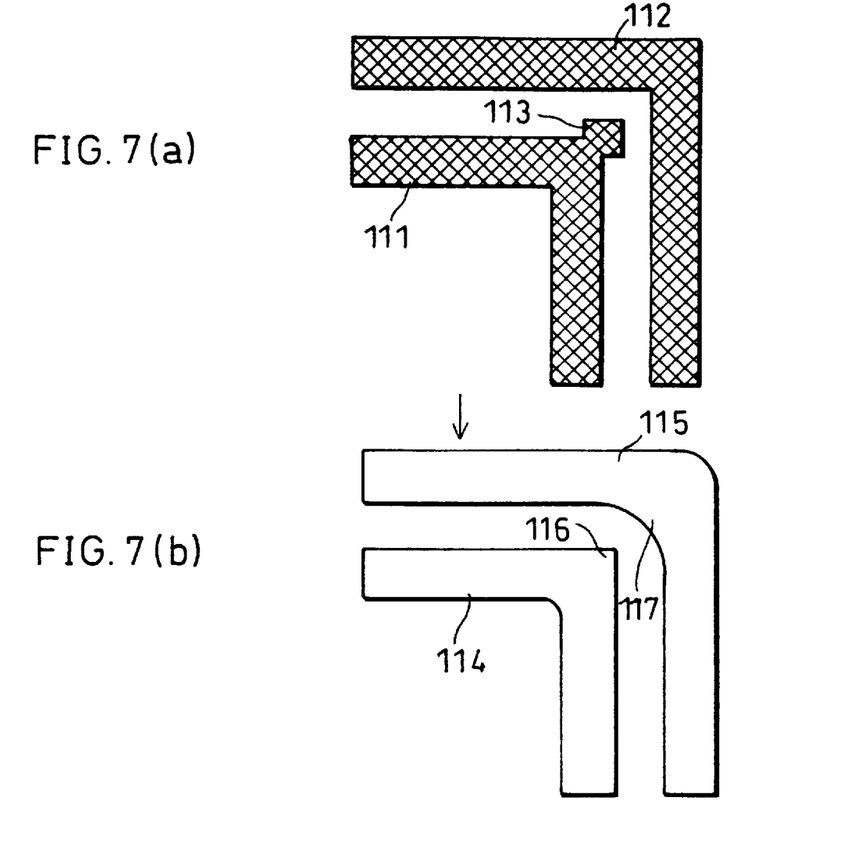
FIG. 7(a) is a plan view schematically showing essential portions of a mask pattern of still another conventional example.
FIG. 7(b) is a plan view schematically showing essential portions of a resist pattern corresponding to the mask pattern of FIG. 7(a)

As shown in FIG. 7(a), for the mask pattern of the photomask for use in the projection with a reduction of ⅕, chrome patterns 111 and 112 of a L-shape having a width of 1.25 μm are formed in parallel on a transparent substrate in such a manner that respective corners of the bent portions are positioned close to each other. Here, the chrome patterns 111 and 112 are placed at an interval of 1.25 μm. Then, a 0.20 μm square auxiliary chrome pattern 113 is formed at the corner of the chrome pattern 111 so as to partially overlap the chrome pattern 111 by a square of 0.05 μm. The resulting mask pattern is transferred onto the positive photoresist film on the semiconductor substrate using KrF eximer laser having a wavelength of 248 nm. As a result, as shown in FIG. 7(b), the mask pattern is projected on the resist film with a reduction of ⅕, thereby forming resist patterns 114 and 115 having a width of 0.25 μm.

The chrome patterns 111 and 112 serving as the mask pattern and the auxiliary chrome pattern 113 are all made of Cr. Therefore, a corner 116 of the resist pattern 114 is regulated by the mask pattern made of Cr. However, as the auxiliary chrome pattern 113 has a size of not more than the wavelength of the exposure light, at the corner 116 of the resist pattern 114, a pattern in the shape of the auxiliary chrome pattern 113 is not formed.

Therefore, as shown in FIG. 7(b), by the effect of the auxiliary chrome pattern 113, the deformation of the corner 116 of the resist pattern 114 is not observed. However, another problem arises in that a corner 117 of the adjoining resist pattern 115 is deformed by expansion to be rounded.

Such deformation by expansion of the corner 117 of the resist pattern 115 occurs as the interval between ① the auxiliary chrome pattern 113 and ② the chrome pattern 112 is not more than the wavelength of the exposure light, the resolution in the area between ① and ② is difficult to be achieved. In the worst case, the corner 116 of the resist pattern 114 and the corner 117 of the resist pattern 115 may be connected by the described expansion.

In the below-presented fourth conventional example, the method of forming the resist pattern adopting the second method of suppressing the backward shift of the resist pattern will be explained in reference to FIG. 8(a) and FIG. 8(b).

Fourth Conventional Example

The second method is to adjust the size or the shape of the resist pattern using a phase-shifting mask. In the phase-shifting method, a contrast in the exposure process is increased utilizing a difference in phase of light.

The phase shifter for use in the phase-shifting method is determined so as to shift the phase of the transmitting light from the original phase by 180°. Therefore, when exposing the phase shifter having a size of substantially equivalent to the wavelength of the exposure light to the resist, a shield state occurs as the light transmitting through the phase shifter and the light transmitting the circumference of the phase shifter interface with each other, and an exposure is not performed. Therefore, the resist pattern is formed in the shape of the phase shifter itself. Additionally, a higher contrast in the exposure process can be achieved compared with that of the chrome pattern, thereby forming the resist pattern with an improved precision.

As shown in FIG. 8(a) and FIG. 8(b), the method of adjusting the resist pattern using the phase shifter in the mask pattern is adopted.

As shown in FIG. 8(a), a chrome pattern 119 made of a shielding material of Cr, etc., is formed at the main portion of a mask pattern 118 of a predetermined shape. Furthermore, at the leading end portion of the mask pattern 118, a phase shifter 120 made of a SOG (spin on glass) film, a MoSiOxNy film, etc., is formed. Additionally, to form the mask pattern 118 having a width of 1.25 μm on the transparent substrate, the size of the phase shifter 120 with a size of 1.25×1.00 μm is formed when the width of the chrome pattern 119 is 1.25 μm.

The mask pattern 118 is transferred to the positive photoresist film on the semiconductor substrate using a KrF eximer laser having a wavelength of 248 nm. As a result, as shown in FIG. 8(b), the mask pattern 118 is applied onto the resist film with a reduction of ⅕, thereby forming a resist pattern 121 having a width of 0.25 μm.

Here, the main portion of the mask pattern 118 is formed by the chrome pattern 119. Therefore, the main portion of the resist pattern 121 is regulated by the chrome pattern 119. Additionally, the leading end portion of the mask pattern 119 is formed by the phase shifter 120. Therefore, the leading end portion of the resist pattern 121 is regulated by the phase shifter 120.

Therefore, as shown in FIG. 8(b), according to the method of this conventional example, compared with the case of adopting the second conventional example explained in reference to FIG. 6(a) and FIG. 6(b), the backward shift of the leading end portion of the resist pattern 121 can be suppressed. However, the amount "g" of the backward shift is still large (0.09 μm).

As described, in the photo-lithography process using KrF eximer laser wherein the resist pattern having the width substantially equivalent to the wavelength of the exposure light is formed a using the positive photoresist, as shown in FIG. 5(b), the resist pattern 102 is shifted backward by the amount "d" of around 0.13 μm after the patterning. As this amount "d" of the backward shift corresponds to one half of the wavelength of the exposure light, a margin when designing cannot be ensured.

The described conventional methods of suppressing the backward shift of the resist pattern have the following drawbacks.

[1] The Method of Adopting Auxiliary Chrome Pattern (Second and Third Conventional Examples)

In the described second convention example in reference to FIG. 6(a) and FIG. 6(b), by the effect of the auxiliary chrome patterns 105 and 106, the amount "e" of the backward shift of the leading end portion of the resist pattern 107 is significantly reduced to be around 0.05 μm.

However, the area 110 of the adjoining resist pattern 108 is deformed by expansion by an amount "f" of around 0.05

μm. In the worst case, the leading end portion of the resist pattern 107 and the area 110 of the resist pattern 108 may be connected.

In the described third conventional example in reference to FIG. 7(a) and FIG. 7(b), the corner 117 of the resist pattern 115 is deformed as being rounded. Then, in the worst case, the corner 116 of the resist pattern 114 and the corner 117 of the resist pattern 115 may be connected by the described expansion.

The deformation by expansion of the resist pattern occurs as an interval between the auxiliary chrome pattern and the chrome pattern is not more than a wavelength of the exposure light, a resolution of the area at the interval cannot be achieved.

[2] The Method of Adopting Phase-Shifter (Fourth Conventional Example)

In the described fourth conventional example in reference to FIG. 8(a) and FIG. 8(b), by the effect of the phase shifter 120, the backward shift of the leading end portion of the resist pattern 121 after performing a patterning can be suppressed compared with the case of the first conventional example (FIG. 5(a) and FIG. 5(b)). However, an amount "g" of the backward shift is still large (0.09 μm).

As described, in the conventional photomask for use in manufacturing a semiconductor device and the method of forming a resist pattern, the leading end portion of the mask pattern is shifted backward, and an alignment margin when designing is reduced or a deformation of the adjoining resist pattern by expansion occurs, thereby presenting a problem that the adjoining resist patterns may be connected by the described expansion.

SUMMARY OF THE INVENTION

It is an object of the present invention to provide a photomask for use in manufacturing a semiconductor device and a method of forming a resist pattern which realize a fine patterning with high precision.

Specifically, the above object is achieved by suppressing a backward shift of an end portion of the resist pattern as well as a deformation of the resist pattern positioned apart from the end portion by a distance substantially equivalent to the wavelength of the exposure light when forming a pattern having a width substantially equivalent to the wavelength of the exposure light or forming a pattern at an interval substantially equivalent to the wavelength of the exposure light.

In order to achieve the above object, a photomask for use in manufacturing a semiconductor in accordance with the present invention is characterized by including: a mask pattern for use in forming a resist pattern by shielding an exposure light; and an auxiliary pattern having a size of not more than a wavelength of the exposure light, formed at an end portion of the mask pattern, the auxiliary pattern having a function of reducing the exposure light.

According to the described arrangement, by the auxiliary pattern made of a material having a function of reducing the exposure light, light in a vicinity of the end portion of the resist pattern can be reduced. As a result, in the process of exposure, an increase in the exposure light at the end portion of the resist pattern to a greater degree than other portions can be suppressed.

Therefore, even in the case where the exposure is carried out in such a manner that the width of the resist pattern after the exposure is equivalent to the width of the mask pattern (in the case of the reduction-projection, width of mask pattern×scale factor for reduction), the backward shift of the end portion of the resist pattern can be suppressed and the deformation of a resist pattern positioned apart from the end portion by a distance of not more than the wavelength of the exposure light can be prevented.

In order to achieve the above object, another photomask for use in manufacturing a semiconductor in accordance with the present invention is characterized by including: a mask pattern for use in forming a resist pattern by shielding an exposure light; and an auxiliary pattern having a size of not more than a wavelength of the exposure light, formed at an end portion of the mask pattern, the auxiliary pattern having a function of shifting a phase of the exposure light.

According to the described arrangement, by forming the auxiliary pattern made of a material having a function of shifting the phase of the exposure light, a winding of light can be prevented, for example, by inverting the phase of light in a vicinity of the end portion of the resist pattern. As a result, when exposing, an increase in amount of exposure light at the end portion of the resist pattern at a greater degree than other portion can be suppressed.

Therefore, even in the case where the width of the resist pattern after the exposure is equivalent to the width of the mask pattern (in the case of the reduction-projection, width of mask pattern×scale factor for reduction), the backward shift of the end portion of the resist pattern can be suppressed, and the deformation of the resist pattern positioned apart from the auxiliary pattern by a distance of not more than the wavelength of the exposure light can be prevented.

In order to achieve the above object, a method of forming a resist pattern in accordance with the present invention is characterized by including the steps of: forming a resist layer on a semiconductor substrate; and forming a resist pattern on the semiconductor substrate according to a mask pattern of the photomask of the aforementioned structure of the photomask by projecting the exposure light to the resist layer through said photomask.

According to the described method of forming a resist pattern, by forming the auxiliary pattern on the photomask according to the resist pattern as desired, and projecting the exposure light having an appropriate wavelength, the backward shift of the end portion of the resist pattern as well as the deformation of the resist pattern positioned apart from the end portion by a distance substantially equivalent to the wavelength of the exposure light can be suppressed.

The described arrangements of the photomask for use in manufacturing a semiconductor and the method of forming a resist pattern offer a patterning with high precision, and thus a semiconductor device can be manufactured at high yield with high precision and reliability.

For a fuller understanding of the nature and advantages of the invention, reference should be made to the ensuing detailed description taken in conjunction with the accompanying drawings.

DESCRIPTION OF THE EMBODIMENTS

FIRST EMBODIMENT

The following descriptions will explain one embodiment of the present invention in reference to figures.

A photomask for use in manufacturing a semiconductor of the present embodiment is arranged such that a mask pattern made of a shielding material of a Cr film and an MoSiOxNy film is formed on a transparent glass substrate. The photomask is arranged such that on a semiconductor substrate on which a photosensitive positive photoresist for use in patterning is applied, a KrF eximer laser having a wavelength of 248 nm is projected, thereby transferring a pattern according to the mask pattern on the resist by a reduction projection method with a reduction of ⅕.

The semiconductor substrate to be subjected to the described patterning may be a silicon substrate whereon a silicone layer, for example, having a thickness of 0.2 μm and a thin SiO$_2$ layer, for example, having a thickness of around 8 nm are laminated in this order. Then, the surface of the semiconductor substrate is spin coated with a positive photoresist for use in patterning with a thickness of 0.77 μm. Thereafter, the semiconductor substrate is subjected to a baking process for 90 seconds at 90° C. For the positive photoresist, a mixture of alkali-soluble phenol resin and naphthoquinone diazido is typically used, and in the present embodiment, TDUR-P009 available from Tokyo Ohka Kogyo Co., Ltd is adopted.

The photomask is arranged such that on the transparent glass substrate, the Cr film and the MoSiOxNy film are laminated in this order. For the MoSiOxNy film, those of a light reducing type having a transmissivity of KrF eximer laser of from 6 to 8% or a transmissivity of i-ray of from 4 to 8%, or those of a phase shift type may be used.

The exposure, transfer and development processes of the mask pattern are as follows.

A photomask on which the mask pattern is formed is set to an aligner for use in manufacturing a semiconductor device, and using the KrF eximer laser having a wavelength of 248 nm, a pattern is transferred on the resist of the semiconductor substrate by the reduction projection method. Here, in order to obtain the resist pattern as transferred to be a line pattern having a width of 0.25 μm, light is projected, for example, at 310 J/m$^2$ so that a shift amount of the width in the pattern on the positive photoresist becomes almost zero. Thereafter, the semiconductor substrate is subjected to the spin drying process after carrying out (1) baking process for 90 seconds at 107.5° C., (2) developing process using 2.38% alkali developing solution of TMAH (tetra-methylammonium-hydride) for 60 seconds at 24° C., and a washing process with water for 15 seconds.

By the described processes, the mask pattern is applied on the resist film with a reduction of ⅕, thereby forming a resist pattern having a band width of 0.25 μm on the semiconductor substrate.

Thereafter, using the resist pattern as a mask pattern, the polysilicon film is etched by the known method, and a predetermined finest pattern for wiring having a width of around 0.25 μm can be formed with high precision.

The mask pattern of a photomask in accordance with the present embodiment is formed in such a manner that the side in the widthwise direction of the second mask pattern is positioned in a vicinity of and substantially orthogonal to the side in the lengthwise direction of the first mask pattern, and that the auxiliary patterns are formed at two corners of the second mask pattern, positioned in a vicinity of the first mask pattern.

First, in the case where the auxiliary pattern is formed at the corners of the mask pattern composed of a shielding material used in the photomask will be explained in reference to FIG. 1(a), FIG. 1(b) and FIG. 2.

Figure 1A:
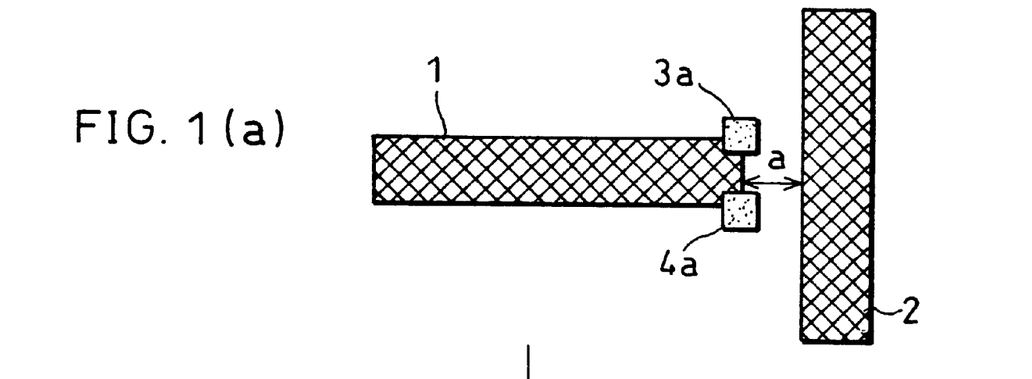
FIG. 1(a) is a plan view schematically showing essential portions of a mask pattern in accordance with one embodiment of the present invention.
Figure 2:
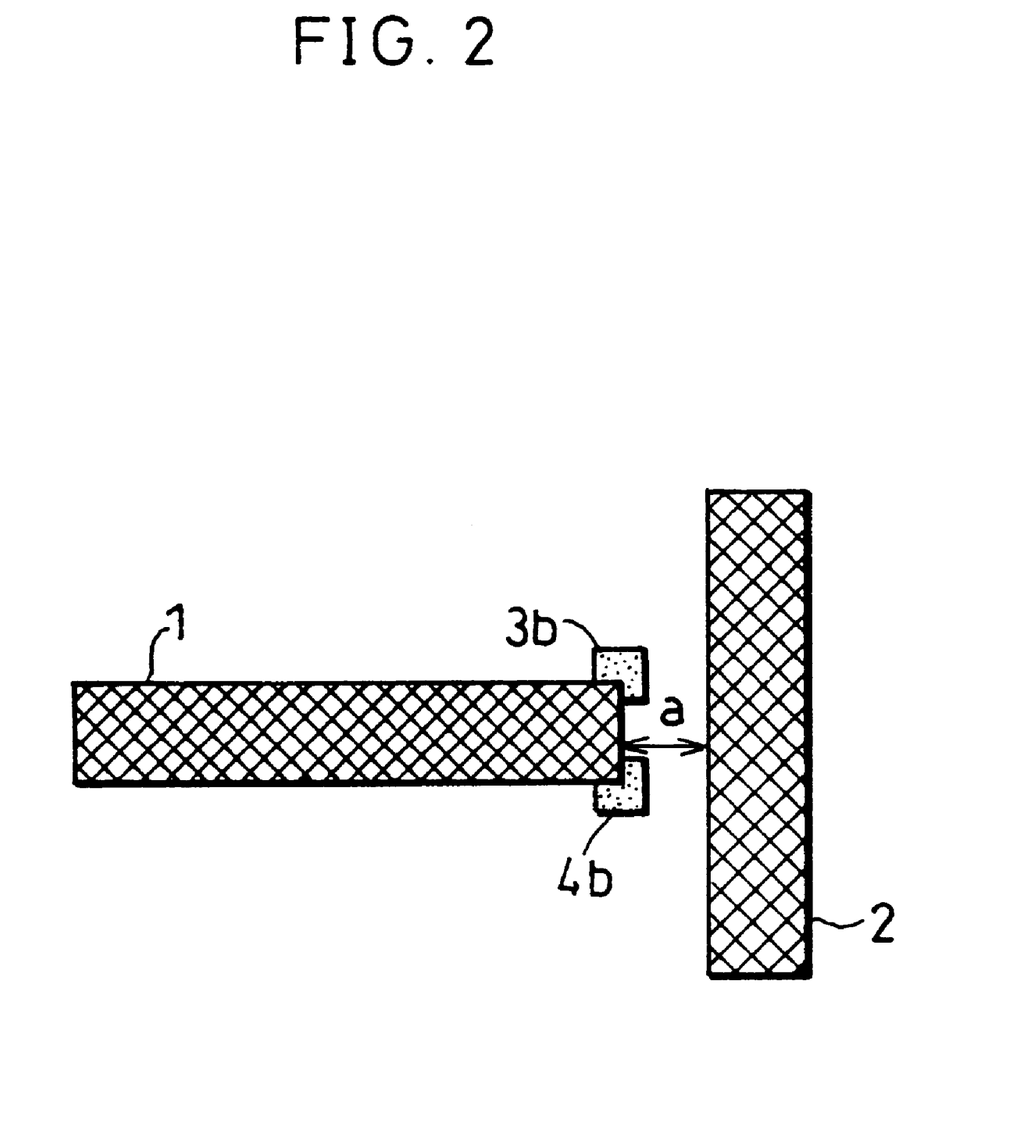
FIG. 2 is a plan view schematically showing essential portions of another mask pattern in accordance with one embodiment present invention.

As shown in FIG. 1(a), the mask pattern serving as the photomask for use in the reduction projection method with a reduction of ⅕ is formed on the transparent substrate in such a manner that chrome patterns 1 and 2 respectively having a width of 1.25 μm are placed at an interval "a" of 1.25 μm. Specifically, the chrome pattern 2 serving as the first mask pattern and the chrome pattern 1 serving as the second mask pattern are placed in such a manner that the side in the widthwise direction of the chrome pattern 1 is positioned in a vicinity of and substantially orthogonal to the side in the lengthwise direction of the chrome pattern 2 as shown in FIG. 1(a). Further, 0.15 μm square auxiliary patterns 3a and 4a having either a function of reducing an exposure light or a function of shifting a phase of the exposure light are formed at both corners of the leading end portion of the chrome pattern 1 so as to partially overlap by, for example, a 0.05 μm square that is ⅑ of the total area.

The adjoining two sides of the auxiliary patterns 3a and 4a are formed parallel to the two sides at the corners in the lengthwise direction at an equal interval. Namely, the auxiliary patterns 3a and 4a are formed at both corners in such a manner that the optical path of the exposure light along each side crosses the area having a width of not more than the wavelength of the exposure light.

Figure 1B:
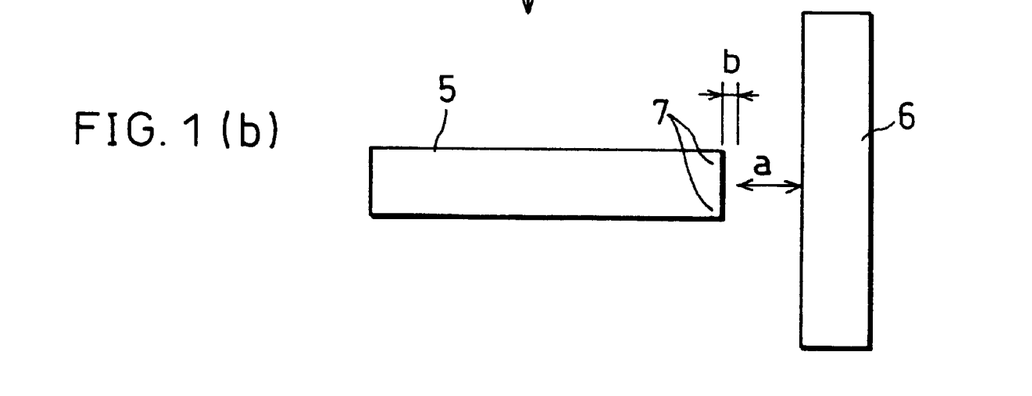
FIG. 1(b) is a plan view schematically showing essential portions of a resist pattern corresponding to the mask pattern of FIG. 1(a)

Here, as shown in FIG. 1(b), corners 7 at the leading end portion of the resist pattern 5 corresponding to the mask pattern 1 are regulated by the chrome pattern 1 and auxiliary patterns 3a and 4a of the mask pattern. However, the auxiliary patterns 3a and 4a respectively have a width of not more than the wavelength of the exposure light, and are made of a light reducing type or phase-shifting type material. Therefore, the shape of the auxiliary patterns 3a and 4a are not transferred to the corners 7 of the leading end portion of the resist pattern 5.

As shown in FIG. 1(b), due to the effects of the auxiliary patterns 3a and 4a, the amount "b" of the backward shift of the leading end portion of the resist pattern 5 is suppressed to be around 0.05 μm. Here, the amount "b" of the backward shift is substantially equivalent to that of the second conventional example explained earlier. By the effects of the auxiliary patterns 3a and 4a, the corners 7 of the leading end portion of the resist pattern 5 are not deformed as being rounded nor shifted backward, thereby forming a projected corner according to the mask pattern. Furthermore, like the third conventional example, by the effects of the auxiliary patterns 3b and 4b, the deformation by expansion of the resist pattern 6 corresponding to the mask pattern 1 due to the effect of the auxiliary pattern can be prevented.

As shown in FIG. 1(a), the mask pattern as explained above is arranged such that the auxiliary patterns 3a and 4b are formed on the chrome pattern 1 so as to partially overlap. However, it may be also arranged such that the chrome pattern 1 partially overlaps the auxiliary patterns 3b and 4b as shown in FIG. 2.

Figure 3A:
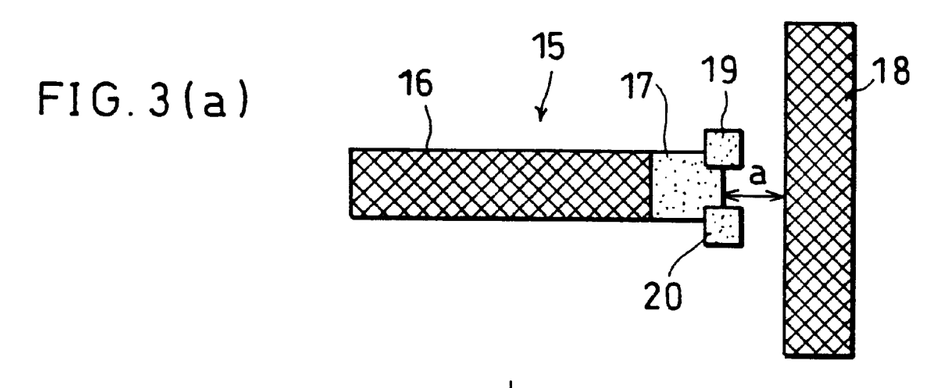
FIG. 3(a) is a plan view schematically showing essential portions of still another mask pattern in accordance with one embodiment of the present invention.

Next, explanations will be given through the case where an auxiliary pattern is formed at a corner of the mask pattern made of a material having the function of shifting a phase of the exposure light in reference to FIG. 3 (a).

As shown in FIG. 3(a), the mask pattern of the photomask for use in projection with a reduction of ⅕ is formed on a transparent substrate such that the chrome pattern 15 and the chrome pattern 18 respectively having a width of 1.25 μm are placed with an interval "a" of 1.25 μm. Specifically, the chrome pattern 18 serving as the first mask pattern and the mask pattern 15 serving as the second mask pattern are placed in such a manner that the side in the widthwise direction of the chrome pattern 15 is positioned in a vicinity of and substantially orthogonal to the side in the lengthwise direction of the mask pattern 18 as shown in FIG. 3(a). The mask pattern 15 is essentially composed of a chrome pattern 16 made of a light-shielding material such as Cr, etc., and also includes a phase shifter 17 with a size of 1.25×1.00 μm consisting of an MoSiOxNy film at the leading end portion of the mask pattern 15.

Further, 0.15 μm square auxiliary patterns 19 and 20 having either an exposing light reducing function or a phase-shifting function are formed at both corners of the phase shifter 17 at the leading end of the mask pattern 15 so as to partially overlap by, for example, 0.05 μm square that is ⅑ of the total area.

The photomask is arranged such that the Cr film and the MoSiOxNy film are laminated on the transparent glass substrate. For the MoSiOxNy film, those of a light reducing type having a transmissivity of KrF eximer laser of from 6 to 8% or a transmissivity of i-ray of from 4 to 8%, or those of a phase shift type may be used.

Then, following the same procedure as that explained in reference to FIG. 1(a) and FIG. 1(b), the mask pattern is transferred to the positive photoresist film on the semiconductor substrate using the KrF eximer laser having a wavelength of 248 nm. As a result, the mask pattern is applied on the resist film with a reduction of ⅕, and as shown in FIG. 3(b), the resist pattern having a width of 0.25 μm is formed.

Figure 3B:
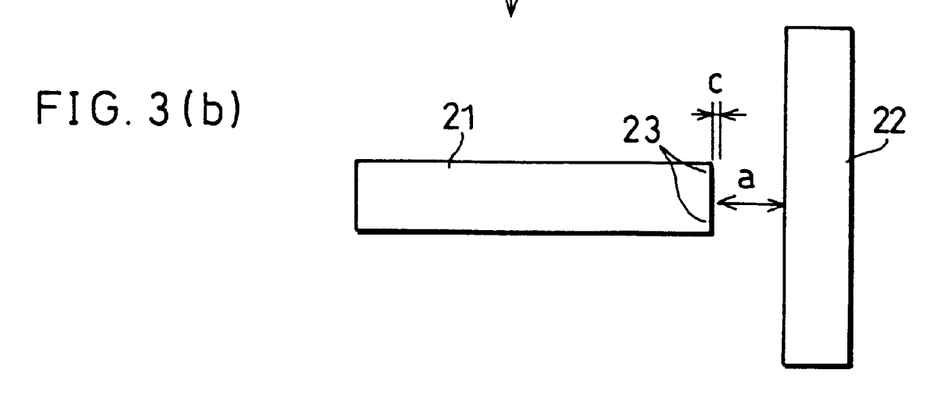
FIG. 3(b) is a plan view schematically showing essential portions of a resist pattern corresponding to the mask pattern of FIG. 3(a)

Here, as shown in FIG. 3(b), corners 23 at the leading end portion of the resist pattern 21 corresponding to the mask pattern 15 are regulated by the phase shifter 17 of the mask pattern 15 and auxiliary patterns 19 and 20. However, the auxiliary patterns 19 and 20 respectively have a size of not more than the wavelength of the exposure light, and are made of a light reducing type or phase-shifting type material. Therefore, the auxiliary patterns 19 and 20 are not formed at corners 23 of the leading end portion of the resist pattern 21.

As shown in FIG. 3(b), by the effects of the phase shifter 17 and the auxiliary patterns 19 and 20, the amount "c" of the backward shift of the leading end portion of the resist pattern 21 is suppressed to be around 0.02 μm. By the effects of the auxiliary patterns 19 and 20, the corners 23 of the leading end portion of the resist pattern 21 are not deformed as being rounded nor shifted backward, thereby forming projected corners according to the mask pattern. Furthermore, like the second conventional example, the deformation by expansion of the resist pattern 22 corresponding to the mask pattern 18 due to the effect of the auxiliary pattern is prevented by the auxiliary patterns 19 and 20.

As shown in FIG. 3(a), the mask pattern as explained in the above is arranged such that the auxiliary patterns 19 and 20 are formed on the chrome pattern 17 so as to partially overlap. However, it may be also arranged such that the chrome pattern 17 partially overlaps the auxiliary patterns 19 and 20.

The above explanations on the mask pattern have been given through the case where the exposure light are wound from three directions with respect to the chrome pattern. In the following another embodiment of the present invention, explanations will be given through the case where the exposure light is wound from two directions with respect to the chrome pattern.

SECOND EMBODIMENT

Figures 4A, 4B:
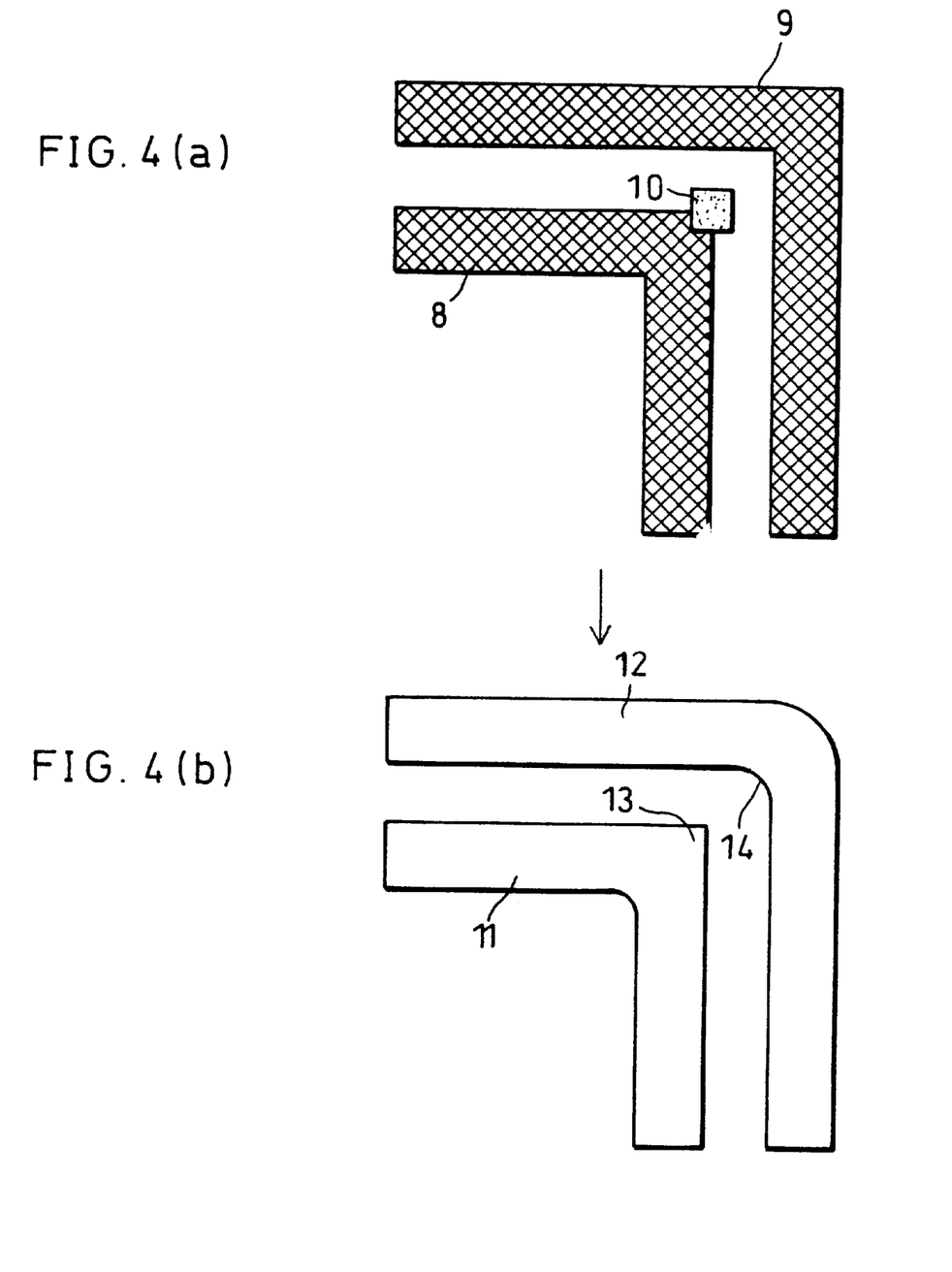
FIG. 4(a) is a plan view schematically showing essential portions of a mask pattern in accordance with another embodiment of the present invention.
FIG. 4(b) is a plan view schematically showing essential portions of a resist pattern corresponding to the mask pattern of FIG. 4(a)

The following descriptions will explain another embodiment of the present invention in reference to FIG. 4(a) and FIG. 4(b).

The mask pattern of the photomask in accordance with the present embodiment is arranged such that the L-shaped second mask pattern is formed inside the L-shaped first mask pattern in parallel so as to be positioned close to each other. Further, the auxiliary pattern is formed at the corner of the second mask pattern in a vicinity of the first mask pattern.

As shown in FIG. 4(a), the mask pattern of the photomask for use in projection with a reduction of ⅕ is formed on a transparent substrate such that the chrome pattern 8 and the chrome pattern 9 respectively having a width of 1.25 μm are placed with an interval of 1.25 μm. Specifically, the L-shaped chrome pattern 8 serving as the second mask pattern is formed inside the L-shaped mask pattern 9 serving as the first mask pattern so as to be substantially parallel to each other. Further, a 0.20 μm square auxiliary pattern 10 is formed at a corner of the chrome pattern 8 so as to partially overlap by, for example, 0.05 μm square that is ¹⁄₁₆ of the total area.

Then, following the same procedure as that explained in reference to FIG. 1(a) and FIG. 1(b), the mask pattern is transferred to the positive photoresist film on the semiconductor substrate using a KrF eximer laser having a wavelength of 248 nm. As a result, the mask pattern is applied on the resist film with a reduction of ⅕, and as shown in FIG.

4(b), thereby forming the resist patterns 11 and 12 having a width of 0.25 μm.

Here, a corner 13 of the resist pattern 11 is regulated by the chrome pattern 8 of the mask pattern and the auxiliary pattern 10, and a corner 14 of the resist pattern 12 are regulated by the chrome pattern 9 of the mask pattern. However, the auxiliary pattern 10 has a size of not more than the wavelength of the exposure light, and is made of a light reducing type or phase-shifting type material. Therefore, the auxiliary pattern 10 is not formed on the resist pattern 10.

As shown in FIG. 4(b), by the effect of the auxiliary pattern 10, the corner 13 of the resist pattern 11 is not deformed as being rounded nor shifted backward, thereby forming a projected corner according to the mask pattern. Furthermore, the corner 14 of the resist pattern 12 is rounded without being deformed, thereby forming a recessed portion according to the mask pattern. As a result, an alignment margin when forming a contact at the bent portion can be ensured.

As shown in FIG. 4(a), the mask pattern of the present embodiment is arranged such that auxiliary patterns are not formed other than the corner of the bent portion for the following reason. That is, as the chrome pattern 9 is formed, the effect of winding of the exposure light at the corner of the chrome pattern 8 is reduced from three directions to two directions, and a backward shift in an extending direction from the chrome pattern 8 is reduced compared with the case of an independent pattern.

As shown in FIG. 4(a), the mask pattern adopted in the present embodiment is arranged such that the auxiliary pattern 10 partially overlaps the chrome pattern 8. However, it may be also arranged such that the chrome pattern 8 overlaps the auxiliary pattern 10.

The described photomask of the present invention suppresses the backward shift occurred when forming the resist pattern so as to have a width substantially equivalent to the wavelength of the exposure light or at an interval substantially equivalent to the wavelength of the exposure light using the exposure light to the same level as the second conventional example explained earlier, without deforming the adjoining resist pattern by expansion.

As shown in FIG. 1(a) through FIG. 4(a), the photomask of the present invention is arranged such that the auxiliary pattern of a size of not more than the wavelength of the exposure light, which has a function of reducing the exposure light or shifting the phase of the exposure light, is formed at the corner of the mask pattern.

As to the auxiliary pattern having the exposure light reducing function, by adopting those having a transmissivity of not more than about 10% with respect to the exposure light, the same effects as achieved from the described preferred embodiments can be achieved. For the phase-shifting type material having the function of shifting the phase of the exposure light, it is desirable to adopt the material which can shift the phase of the exposure light by 180°; however, the present invention is not limited to the above material, and any of those having a function of shifting the phase to some extent may be adopted.

In the present invention, for the width of the resist pattern equivalent to the wavelength of the exposure light, in the pattern transferred to the resist film , the width of each resist pattern is not more than around 0.30 μm when exposing using the KrF eximer laser (248 nm) and not more than around 0.25 μm when exposing using the ArF eximer laser (193 nm).

The positive photoresist for use in the present invention is not particularly limited. A generally used positive photoresist may be used. In each of the described embodiments, examples of the scale factor for the reduction are given; however, these scale factors are not particularly limited in the present invention.

Furthermore, in each of the described preferred embodiments, the auxiliary patterns (3a, 4a, 3b, 4b, 10, 19 and 20) of a square shape are adopted; however, the shape of the auxiliary pattern is not particularly limited in the present invention, and those of any shape formed at a corner so as to cross a light path along each side of the mask pattern in an area having a width of not more than the wavelength of the exposure light may be used.

As is clear from the above-explained two preferred embodiments of the present invention, the photomask for use in manufacturing a semiconductor device and the pattern forming method thereof are applicable to the case of forming a pattern made of other material than polysilicon such as metal silicide, aluminum series metal, or a metal alloy, etc.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A photomask for use in manufacturing a semiconductor device comprising:

a mask pattern for use in forming a resist pattern by shielding an exposure light; and an auxiliary pattern formed in a shape protruded from a corner of said mask pattern, area having a center positioned in the vicinity of an apex of the corner of said said auxiliary pattern being configured such that said auxiliary pattern is not transferred to said resist pattern and said auxiliary pattern having a function of reducing the exposure light.

2. The photomask according to claim 1, wherein:

said auxiliary pattern has a function of shifting a phase of the exposure light.

3. The photomask according to claim 1, wherein:

said mask pattern includes a phase shifting section for shifting a phase of the exposure light, said phase shifting section being formed at an end portion of said mask pattern where said auxiliary pattern is formed.

4. The photomask according to claim 1, wherein:

said mask pattern includes a band-shaped first mask pattern and a second mask pattern placed in such a manner that a side in a widthwise direction of said second mask pattern is positioned in a vicinity of a side in a lengthwise direction of said first mask pattern, and said auxiliary pattern is formed at two corners of said second mask pattern in a vicinity of said first mask pattern.

5. The photomask according to claim 1, wherein:

said mask pattern includes a first mask pattern having a bent portion, and a second mask pattern having a bent portion placed in a vicinity of the bent portion of said first mask pattern, said second mask pattern being formed inside said first mask pattern, and said auxiliary patterns are formed at a corner of said bent portion of said second mask pattern, said corner being positioned in a vicinity of said first mask pattern.

6. The photomask according of claim 1, wherein:

a width of said resist pattern is substantially equivalent to the wavelength of the exposure light.

7. The photomask according to claim 1, wherein:
said resist pattern is formed at an interval substantially equivalent to the wavelength of the exposure light.

8. The photomask according to claim 1, wherein:
said auxiliary pattern is made of MoSiOxNy.

9. The photomask according to claim 3, wherein:
said phase shifting section is made of MoSiOxNy.

10. The photomask according to claim 1, wherein said auxiliary pattern overlaps the corner of said mask pattern.

11. The photomask according to claim 1, wherein the corner of said mask pattern overlaps said auxiliary pattern.

12. A photomask for use in manufacturing a semiconductor device comprising:
a mask pattern for use in forming a resist pattern by shielding an exposure light; and
an auxiliary pattern formed in a shape protruded from a corner of said mask pattern, said auxiliary pattern being configured such that said auxiliary pattern is not transferred to said resist pattern and said auxiliary pattern having a function of shifting a phase of the exposure light.

13. A photomask for use in manufacturing a semiconductor device comprising:
a mask pattern for use in forming a resist pattern by shielding an exposure light; and
an auxiliary pattern formed at a corner of said mask pattern, said auxiliary pattern being configured such that said auxiliary pattern is not transferred to said resist pattern and said auxiliary pattern having a function of reducing the exposure light.

14. A photomask for use in manufacturing a semiconductor device comprising:
a mask pattern for use in forming a resist pattern by shielding an exposure light; and
an auxiliary pattern formed at a corner of said mask pattern, said auxiliary pattern being configured such that said auxiliary pattern is not transferred to said resist pattern and said auxiliary pattern having a function of shifting a phase of the exposure light.

15. A photomask for suppressing a shift of an end portion of a photosensitive layer onto which a pattern of said photomask is transferred, said photomask comprising:
a main mask pattern comprising a light-shielding material;
an auxiliary mask pattern comprising a light-reducing material formed in an overlapping relationship with the light-shielding material at one or more corners of said main mask pattern which correspond to the end portion of the photosensitive layer, said auxiliary mask pattern being configured such that said auxiliary mask pattern is not transferred to said photosensitive material.

16. The photomask according to claim 15, wherein said light-reducing material overlaps the light-shielding material at said one or more corners of said main mask pattern.

17. The photomask according to claim 15, wherein the light-shielding material at said one or more corners of said main mask pattern overlaps said light-reducing material.

18. The photomask according to claim 15, wherein said auxiliary mask pattern comprises one or more squares of the light-reducing material each of which partly overlaps the light-shielding material at a corresponding one of said one or more corners of said main mask pattern.

19. The photomask according to claim 15, wherein said auxiliary mask pattern comprises one or more squares of the light-reducing material each of which is partly overlapped by the light-shielding material at a corresponding one of said one or corners of said main mask pattern.

20. A photomask for suppressing a shift of an end portion of a photosensitive layer onto which a pattern of said photomask is transferred, said photomask comprising:
a main mask pattern comprising a light-shielding material;
an auxiliary mask pattern comprising at a phase-shifting material formed in an overlapping relationship with the light-shielding material at one or more corners of said main mask pattern which correspond to the end portion of the photosensitive material, said auxiliary mask pattern being configured such that said auxiliary mask pattern is not transferred to said photosensitive material.

21. The photomask according to claim 20, wherein said phase-shifting material overlaps the light-shielding material at said one or more corners of said main mask pattern.

22. The photomask according to claim 20, wherein the light-shielding material at said one or more corners of said main mask pattern overlaps said phase-shifting material.

23. The photomask according to claim 20, wherein said auxiliary mask pattern comprises one or more squares of the phase-shifting material each of which partly overlaps the light-shielding material at a corresponding one of said one or more corners of said main mask pattern.

24. The photomask according to claim 20, wherein said auxiliary mask pattern comprises one or more squares of the phase-shifting material each of which is partly overlapped by the light-shielding material at a corresponding one of said one or comers of said main mask pattern.

25. A photomask for suppressing a shift of an end portion of a photosensitive layer onto which a pattern of said photomask is transferred, said photomask comprising:
a main mask pattern;
an auxiliary mask pattern comprising a light-reducing material formed in an overlapping relationship with one or more corners of said main mask pattern which correspond to the end portion of the photosensitive layer, said auxiliary mask pattern being configured such that said auxiliary mask pattern is not transferred to said photosensitive material.

26. The photomask according to claim 25, wherein said main mask pattern comprises a light-shielding material and a phase-shifting material.

* * * * *